(12) United States Patent
Chen et al.

(10) Patent No.: US 11,099,838 B1
(45) Date of Patent: Aug. 24, 2021

(54) METHOD AND SYSTEM FOR RECOVERY FOR CUSTOM INTEGRATED CIRCUIT

(71) Applicant: Quanta Computer Inc., Taoyuan (TW)

(72) Inventors: I-Chung Chen, Taoyuan (TW); Chia-Yu Lin, Taoyuan (TW)

(73) Assignee: QUANTA COMPUTER INC., Taoyuan (TW)

(*) Notice: Subject to any disclaimer, the term of this patent is extended or adjusted under 35 U.S.C. 154(b) by 16 days.

(21) Appl. No.: 16/802,230

(22) Filed: Feb. 26, 2020

(51) Int. Cl.
*G06F 8/71* (2018.01)
*G06F 30/34* (2020.01)
*G06F 8/61* (2018.01)

(52) U.S. Cl.
CPC ............... *G06F 8/71* (2013.01); *G06F 8/63* (2013.01); *G06F 30/34* (2020.01)

(58) Field of Classification Search
CPC ............. G06F 8/63; G06F 8/71; G06F 30/34
See application file for complete search history.

(56) References Cited

U.S. PATENT DOCUMENTS

| | | | | |
|---|---|---|---|---|
| 10,395,038 | B2* | 8/2019 | Chang | G06F 8/654 |
| 10,705,827 | B2* | 7/2020 | Su | G06F 8/654 |
| 10,997,296 | B2* | 5/2021 | Heck | G06F 3/0659 |
| 2012/0110379 | A1* | 5/2012 | Shao | G06F 11/1417 714/15 |
| 2013/0036300 | A1* | 2/2013 | Baik | G06F 9/4401 713/2 |
| 2017/0109235 | A1* | 4/2017 | Hung | G06F 11/1417 |
| 2017/0131991 | A1* | 5/2017 | Su | G06F 8/654 |
| 2017/0155560 | A1* | 6/2017 | Lee | H04L 41/5009 |
| 2018/0060080 | A1* | 3/2018 | Spottswood | G06F 9/4403 |
| 2018/0173516 | A1* | 6/2018 | Tung | G06F 8/63 |

* cited by examiner

*Primary Examiner* — Marina Lee
(74) *Attorney, Agent, or Firm* — Nixon Peabody LLP

(57) ABSTRACT

A system and method for monitoring and recovering a heterogeneous integrated circuit, such as an FPGA, operating with firmware. A firmware image for the integrated circuit is stored in a storage device. The operational status of the integrated circuit is periodically determined via a controller such as a BMC. A failure of the integrated circuit is determined. The stored firmware image is sent to the integrated circuit. The firmware image is installed on the integrated circuit. The controller determines whether the installation of the firmware image results in restoration of the integrated circuit.

16 Claims, 4 Drawing Sheets

METHOD AND SYSTEM FOR RECOVERY FOR CUSTOM INTEGRATED CIRCUIT

TECHNICAL FIELD

The present disclosure relates generally to recovery of firmware for a custom integrated circuit. More particularly, aspects of this disclosure relate to firmware recovery for a custom integrated circuit such as an FPGA.

BACKGROUND

Servers are employed in large numbers for high demand applications such as network based systems or data centers. The emergence of the cloud for computing applications has increased the demand for data centers and other heavy operational demands. Data centers have numerous servers that store data and run applications accessed by remotely connected computer device users. A typical data center has physical chassis structures with attendant power and communication connections. Each rack may hold multiple computing servers and storage servers.

Due to an increased variety of potential specialized applications, server design has been moving to heterogeneous computing architectures in recent years. Using a heterogeneous computing architecture allows sharing the loading for CPUs in the system, as well as for processing data for specific tasks. Thus, heterogeneous architectures improve server performance through load sharing and sharing commands for specialized functions. These improvements are prevalent on servers for new generation technology such as artificial intelligence (AI), 5G, machine learning, and big data analysis applications.

Custom integrated circuits (ICs), such as Field Programmable Gate Array (FPGA) integrated circuits are generally used in heterogeneous computing architectures because FPGAs have the benefit of flexible design. An FPGA allows a user to design different functions for the gates on the FPGA. The benefit of using an FPGA is that a user can use software to "program" the gate hardware of the FPGA IC to execute a specified task or tasks. Since the FPGA is hardware, it can perform specialized tasks faster than a homogeneous processor that executes a software program. Thus, an FPGA may be "programmed" to perform multiple different tasks at hardware speeds, thereby obviating the need for specialized hardware for performing such tasks.

Since such custom ICs are configured by users, there may be existing design defects in the configuration software, thereby resulting in system hang-up or error during run time of the integrated circuit. Therefore, there is a need for an auto recovery mechanism for custom ICs to improve the reliability of such systems. However, there is no auto recovery mechanism for custom ICs in existing servers.

Thus, there is a need for a system that includes an auto recovery mechanism to monitor and recover custom IC firmware. There is also a need for a system that can monitor and recover a baseboard management controller (BMC) at the same time of the recovery of the custom IC firmware. There is a further need for a system that does not require CPU cycle time to handle the polling process for custom integrated circuits to improve system performance. There is another need for a system to improve system reliability by recovering firmware in spite of side errors occurring.

SUMMARY

One disclosed example is a system that provides monitoring and recovery for heterogeneous components. The system includes an integrated circuit operating with firmware. The system includes a storage device coupled to the integrated circuit. The storage device stores a firmware image for the integrated circuit. A controller is coupled to the integrated circuit. The controller is operable to periodically determine the operational status of the integrated circuit, and determine a failure of the integrated circuit from the determined operational status. The controller sends the stored firmware image to the integrated circuit and installs the firmware image on the integrated circuit. The controller determines whether the installation of the firmware image results in restoration of the integrated circuit.

In other implementations of the disclosed example system, the controller is a baseboard management controller or a field programmable gate array. In another implementation, the integrated circuit is one of a field programmable gate array or a baseboard management controller. In another implementation, the controller is operable to reset the integrated circuit in response to detecting a failure. In another implementation, the integrated circuit sends periodic commands to the controller, and the controller determines failure based on the periodic commands. In another implementation, the system includes a non-volatile random access memory coupled to the integrated circuit and the controller. The integrated circuit periodically writes state data to the non-volatile random access memory. The controller determines the failure of the integrated circuit based on the state data. In another implementation, the storage device is a flash memory. In another implementation, the controller is in communication with one of an operating system or a basic input output system (BIOS). In another implementation, the operating system or BIOS is operable to disable a hardware port connected to the integrated circuit if the installation of the firmware image does not result in restoration of the integrated circuit.

Another disclosed example is a method of monitoring and recovering a heterogeneous integrated circuit operating with firmware. A firmware image is stored for the integrated circuit in a storage device. The operational status of the integrated circuit is periodically determined via a controller. A failure of the integrated circuit is determined. The stored firmware image is sent to the integrated circuit. The firmware image is installed on the integrated circuit. The controller determines whether the installation of the firmware image results in restoration of the integrated circuit.

In other implementations of the disclosed example method, the controller is a baseboard management controller or a field programmable gate array. In another implementation, the integrated circuit is one of a field programmable gate array or a baseboard management controller. In another implementation, the method includes resetting the integrated circuit in response to detecting a failure. In another implementation, failure is determined based on the periodic commands sent by the integrated circuit to the controller. In another implementation, the periodically determining the operational status of the integrated circuit includes the integrated circuit writing state data to a non-volatile random access memory and the controller reading the written state data. In another implementation, the storage device is a flash memory. In another implementation, the controller is directed by one of an operating system or a basic input output system (BIOS). In another implementation, the method includes disabling a hardware port connected to the integrated circuit if the installation of the firmware image does not result in restoration of the integrated circuit.

Another disclosed example is a computing system including a field programmable gate array (FPGA) integrated circuit operating firmware. The system includes a storage device storing a firmware image of the FPGA integrated circuit coupled to the FPGA integrated circuit. The system includes a baseboard management controller coupled to the FPGA integrated circuit. The baseboard management controller is operable to periodically determine the operational status of the FPGA integrated circuit. The baseboard management controller determines whether there is a failure of the FPGA integrated circuit from the determined operational status. The baseboard management controller sends the stored firmware image to the FPGA integrated circuit. The baseboard management controller installs the firmware image on the FPGA integrated circuit. The baseboard management controller determines whether the installation of the firmware image results in restoration of the FPGA integrated circuit.

In other implementations of the disclosed computing system, the FPGA integrated circuit is operable to periodically determine the operational status of the BMC; determine a failure of the BMC from the determined operational status; send a stored BMC firmware image from the storage device to the BMC; install the BMC firmware image on the BMC; and determine whether the installation of the BMC firmware image results in restoration of the BMC.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

Figure 1:
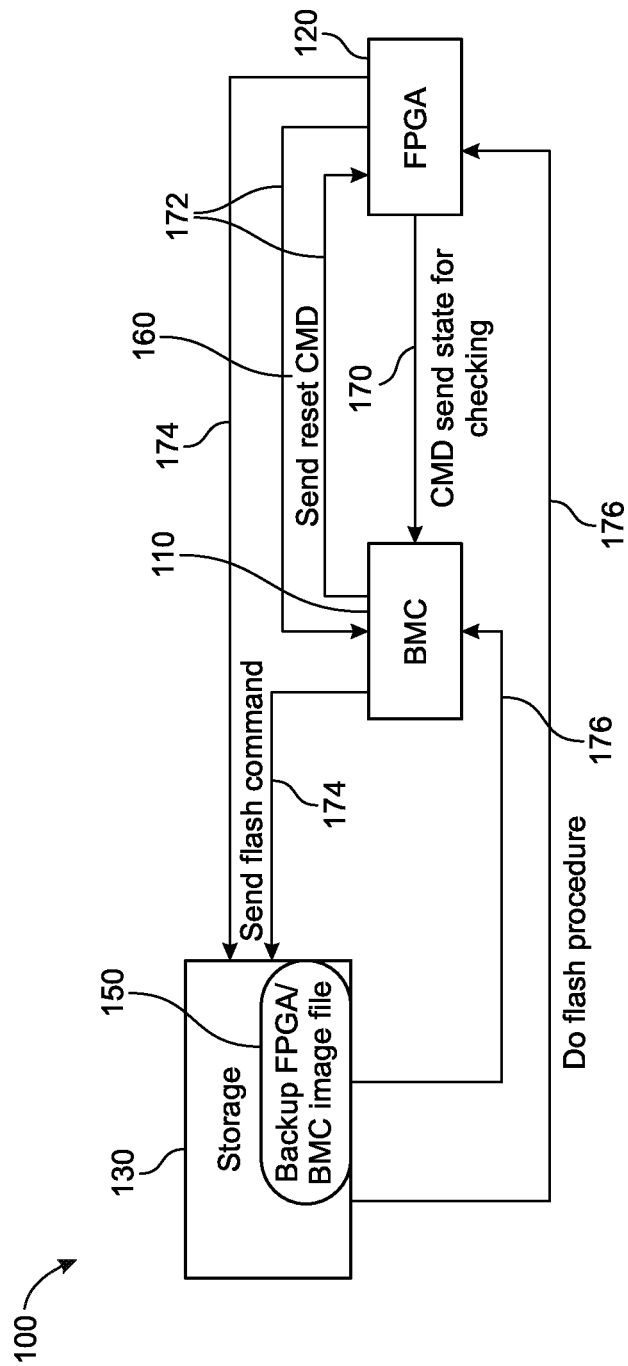
FIG. 1 is a block diagram of an example FPGA based system, according to certain aspects of the present disclosure.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION OF THE ILLUSTRATED EMBODIMENTS

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure relates to providing a backup specialized integrated circuit image file in a storage device such as flash memory. The integrated circuit is checked periodically, and if a failure is detected, the image file may be provided to reset the operation of the integrated circuit.

FIG. 1 shows a system 100 that allows monitoring and recovery for heterogeneous components, such as an integrated circuit. The recovery may be performed automatically using existing controllers of the system 100 via a stored firmware image for the integrated circuit. The system 100 includes a baseboard management controller 110, a specialized integrated circuit, such as a field programmable gate array (FPGA) 120, and a storage device such as a flash memory device 130. In this example, the FPGA 120 is an Intel Arria 10 FPGA SoC, but other specialized heterogeneous integrated circuits such as complex programmable logic devices (CPLD) may employ the principles described herein. In this example, the flash memory device 130 includes a firmware image files 150 for FPGA firmware and BMC firmware. The BMC 110 and the FPGA 120 are coupled to the flash memory device 130. In this example, an Intelligent Platform Management Interface (IPMI) bus 160 connects the BMC 110 with the FPGA 120.

The system 100 provides a reliable operation procedure for the BMC 110 and the FPGA 120 through monitoring and recovery. The firmware images in an image file 150 are a reliable backup firmware image for the recovery of the operation of the BMC 110 or the FPGA 120. These firmware images are stored in the flash memory 130. A watch dog timer is set for both the FPGA 120 and the BMC 110.

The FPGA 120 sends information to the BMC 110 periodically via a command on the IPMI bus 160 (170). The BMC 110 responds to the FPGA 120 when the command is received. The command includes status and error information from the FPGA 120. The response from the BMC 110 to the command includes BMC status information for the FPGA 120 to check. If there is error information in the command to the BMC 110, or the command is not received by the time a time out period set by the watch dog timer expires, the BMC 110 will send a check state command to the FPGA 120. In this example, the check state command will be sent three times by the BMC 110. If no response is received in response to the check state command or the FPGA 120 responds with an error status, the BMC 110 will log a fail state. Similarly, the FPGA 120 can send a check state command to the BMC 110 if no response is received to the command or if an error status is received in the response from the BMC 110. If no response is received in response to the check state command or if a response from the BMC 110 indicates a failure, the FPGA 120 may log a fail state for the BMC 110.

When the no response is received to the check state commands or an error response is received, the FPGA 120 or the BMC 110 will attempt a reset procedure (172). If the reset procedure is successful, the system will return to the normal operation. If the reset is unsuccessful, a check state command will be called again. If the check state command fails or an error response is received, the FPGA 120 or the BMC 110 will call a flash recovery procedure to recover the FPGA/BMC firmware image 150 from the flash memory 130 (174). The firmware image 150 is thus sent to the BMC 110 or the FPGA 120 from the flash memory 130 (176). If the firmware is successfully installed, the BMC 110 or the FPGA 120 notifies a system routine such as a BIOS or operating system (OS) that the BMC 110 or the FPGA 120 has been recovered. The system 100 then returns to the FPGA 120 sending information periodically to the BMC 110.

If the response to the check state command is a failure and the flash firmware image fails, the system notifies the BIOS and OS that the hardware such as the BMC 110 or the FPGA 120 has failed. The BIOS/OS then disables the hardware port connected to the BMC 110 or the FPGA 120. The OS stops access to the FPGA 120 or the BMC 110, and sends an error message to the administrator.

Figure 2:
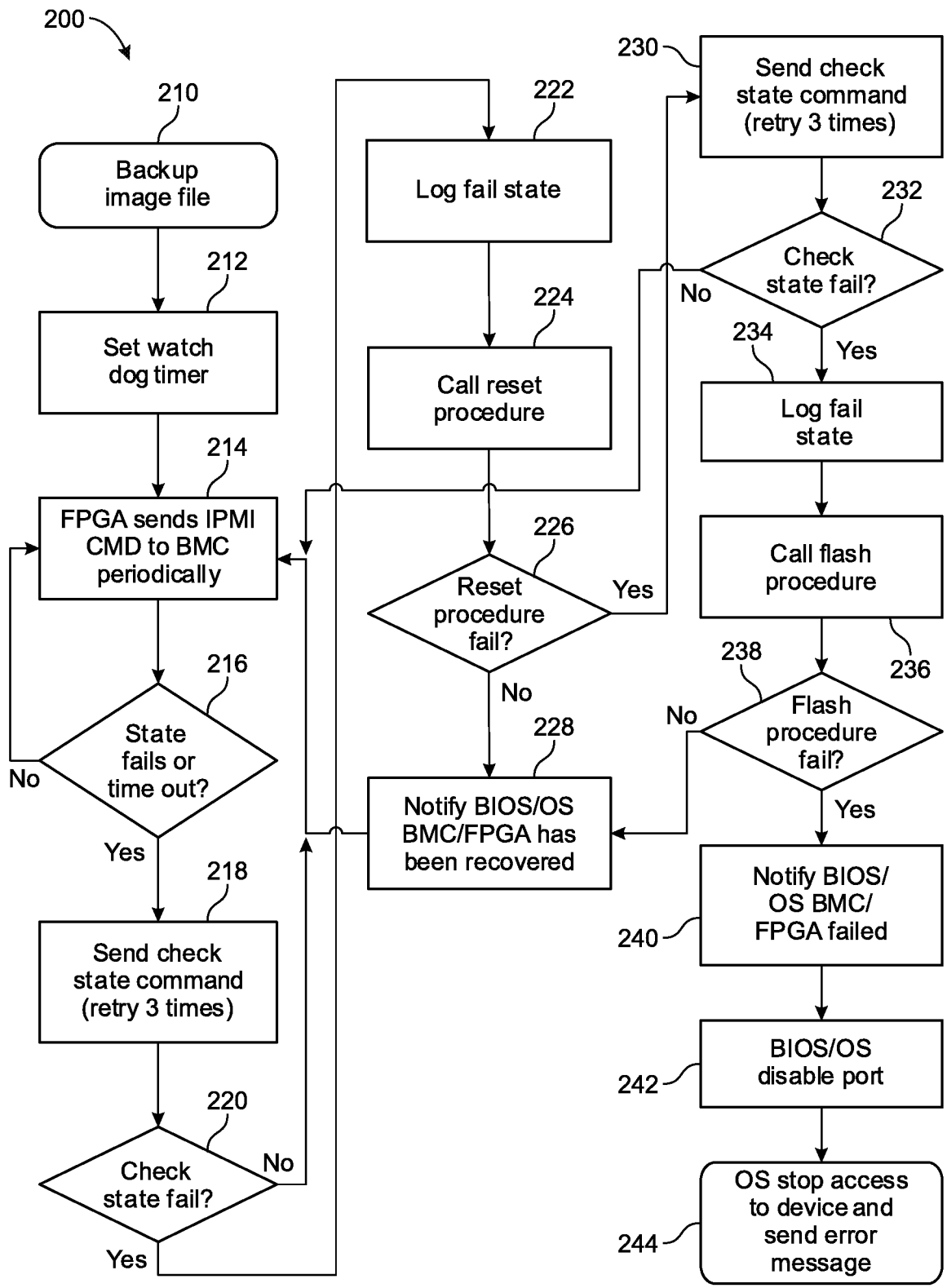
FIG. 2 is a flow diagram of the firmware recovery routine of the example FPGA system in FIG. 1, according to certain aspects of the present disclosure.

FIG. 2 is a flow diagram of the recovery routine 200 executed by the operating system of the system 100 in FIG. 1. The routine 200 backs-up a reliable firmware image such as the BMC and FPGA firmware images in the image file 150 for FPGA/BMC recovery (210). A FPGA/BMC watch dog timer is set (212). The FPGA 120 sends status information via an IPMI command to the BMC 110 periodically according to the watch dog timer (214). The BMC 110 responds to the FPGA 120 with status information when the IPMI command is received. If the response is normal (216), the routine loops back and continues to send information via the IPMI command to the BMC 110 and a response from the BMC 110 to the FPGA 120 (214). If the response or the command includes error information or if no information or response is received during the watchdog period (216), the routine sends a check state command to the FPGA 120 or the BMC 110 (218). The corresponding FPGA 120 or BMC 110 determines whether the response to the check state indicates a failure or if no response is received (220). If the check state indicates a failure or no response is received, either the BMC 110 or the FPGA 120 provide a fail state log entry (222).

If there is a positive response to any of the check state commands (220), the routine loops back to the watch dog state where the FPGA 120 sends periodic commands to the BMC 110 (214). If a response indicating a failure is received or if there is no response to any of the check state commands, a fail state log entry (222) is provided. The FPGA 120 or the BMC 110 then calls a reset procedure to recover the respective FPGA 120 or BMC 110 (224). The reset procedure is then initiated by either the FPGA 120 or the BMC 110. If the FPGA 120 or BMC 110 passes, thereby indicating the reset was successful (226), the routine notifies the BIOS or operating system (OS) that the BMC 110 or the FPGA 120 has recovered (228). The routine loops back and continues to send information via the IPMI command to the BMC 110 (214).

If the reset procedure fails to recover the respective FPGA 120 or the BMC 110 (226), the routine sends a series of check state commands to the FPGA 120 (230). The routine determines whether there is a positive response to any of the check state commands (232). If there is a positive response to any of the check state commands (232), the routine loops back to the watch dog state where the FPGA 120 sends periodic commands to the BMC 110 (214). If there is no response to any of the check state commands or a failure response is received (232), The BMC 110 and the FPGA 120 provides a fail state log entry (234). The FPGA 120 or the BMC 110 then calls for restoring the appropriate firmware image from the stored firmware image 150 in the flash memory 130 to the FPGA 120 or the BMC 110 (236). The stored firmware image from the firmware file 150 is installed on either the FPGA 120 or the BMC 110. The routine then determines whether the FPGA 120 or the BMC 110 is functioning correctly with the installed firmware image (238). If the FPGA 120 or BMC 110 is functioning correctly, the routine notifies the BIOS or OS that the BMC 110 or the FPGA 120 has recovered (228). The routine loops back and continues to send information via the IPMI command to the BMC 110 (214).

If the flash procedure fails (238), the routine notifies the BIOS and OS that the BMC 110 or the FPGA 120 has failed (240). The BIOS or OS will disable the hardware port that is connected to the failed BMC 110 or the failed FPGA 120 (242). The BIOS or OS will send an error message to the administrator (244).

Figure 3:
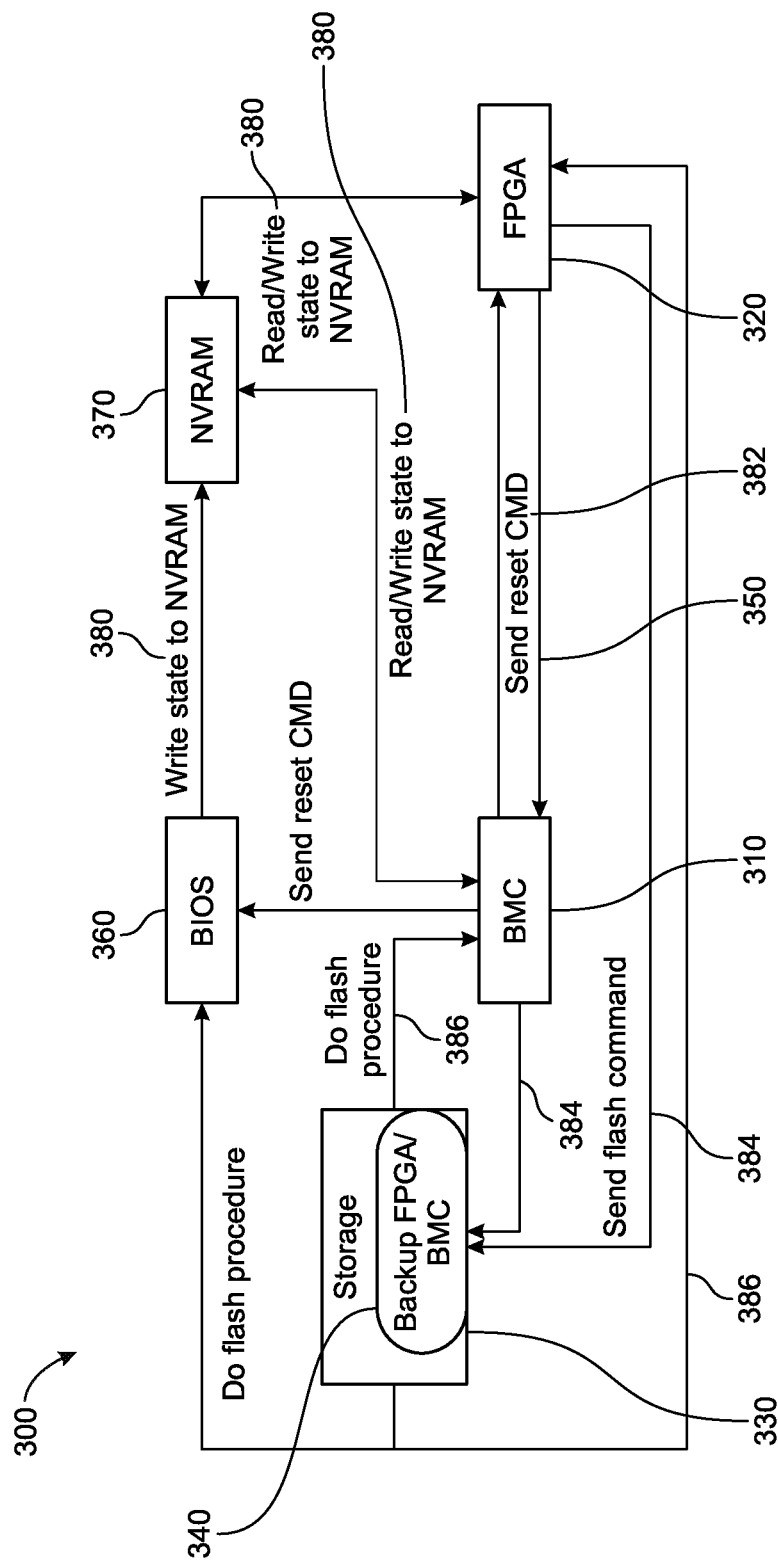
FIG. 3 is a block diagram of another FPGA based system, according to certain aspects of the present disclosure.

FIG. 3 is a block diagram of another example system 300 that allows monitoring of firmware for a heterogeneous integrated circuit. The system 300 includes a baseboard management controller (BMC) 310, a specialized integrated circuit, such as a field programmable gate array (FPGA) 320, and a flash memory device 330. In this example, the flash memory device 330 includes a firmware image file 340 that includes images for FPGA firmware and BMC firmware. The BMC 310 and the FPGA 320 are coupled to the flash memory device 330.

A BIOS 360 is coupled to the flash memory device 330, and the BMC 310. A non-volatile random access memory (NVRAM) 370 is connected to the BIOS 360, the BMC 310 and the FPGA 320. The BIOS 360, the BMC 310 and the FPGA 320 each write state data to the NVRAM 370. The FPGA 320 and the BMC 310 can both read state data from the NVRAM 370 and may therefore determine the status of other components. The BIOS status may also be monitored by either the FPGA 320 or the BMC 310.

The system 300 provides a reliable operation procedure for the FPGA 320. The firmware image file 340 is a reliable backup firmware image for the recovery of the operation of the BMC 310 or the FPGA 320 stored in the flash memory 330. A watch dog timer is set for both the FPGA 320 and the BMC 310.

The BMC 310, the FPGA 320, and the BIOS 360, each write state data to the NVRAM 370 on a periodic basis (380). The BMC 310 reads the written state data in relation to the FPGA 320 and the BIOS 360. The FPGA 320 also reads the written state data from the BMC 310 in relation to the BMC 310. If error information is found in the state data from the FPGA 320, the BMC 310 will send a check state command to the FPGA 320. If error information is found in the state data from the BMC 310, the FPGA 320 will send a check state command to the BMC 310. In this example, the check state command will be sent three times by the BMC 310 or the FPGA 320. If no response is received in response to the check state command or a response indicating a failure is received, the BMC 310 or the FPGA 320 will log a fail state.

When no response is received to the check state or a failure is indicated, the FPGA 320 or the BMC 310 will attempt to reset either the BMC 310 or the FPGA 320 (382). If the reset procedure is successful, the system will return to the normal operation. If the reset is unsuccessful, a check state command will be called again. If the check state fails, the FPGA 320 or the BMC 310 will call a flash procedure to recover the FPGA/BMC firmware by accessing the firmware image from the firmware image file 340 stored in the flash memory 330 (384). The firmware image is thus sent to the BMC 310 or the FPGA 320 (386). If the firmware image is successfully installed, the BMC 310 or the FPGA 320 notifies a system routine, such as the BIOS 360 or the operating system, that the BMC 310 or the FPGA 320 has been recovered. The system 300 then returns to normal operation.

If the response to the check state command is a failure and the flash firmware image fails, the system notifies the BIOS 360 and the operating system that the hardware has failed. The BIOS/operating system disables the hardware port connected to the BMC 310 or the FPGA 320, and the operating system stops access to the FPGA 320 or the BMC 310, and sends an error message to the administrator. The BMC 310 may also independently monitor the state of the BIOS 360 from the status information written in the NVRAM 370. If the status information indicates a BIOS failure, the BMC 310 may attempt to send a reset command and if this fails, may restore a BIOS firmware image from the flash memory 330.

Figure 4:
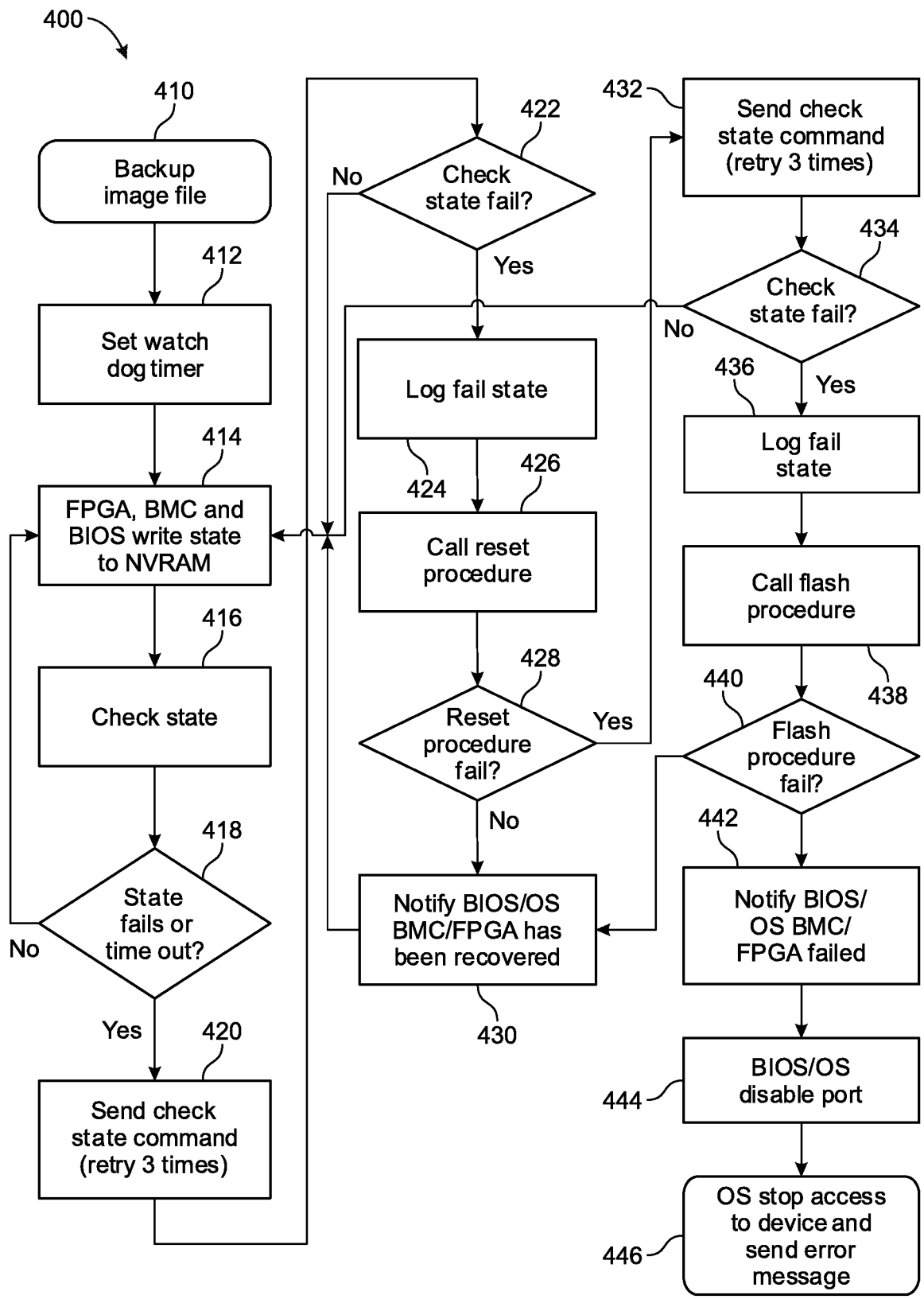
FIG. 4 is a flow diagram of the firmware recovery routine for the example system in FIG. 3, according to certain aspects of the present disclosure.

FIG. 4 is a flow diagram of the recovery routine 400 executed by the operating system of the system 300. The routine 400 backs up a reliable firmware image such as the firmware images in the firmware image file 340 (shown in FIG. 3) for FPGA/BMC recovery (410). A FPGA/BMC watch dog timer is set (412). The BMC 310, FPGA 320, and BIOS 360, each write corresponding state data to the NVRAM 370 periodically (414). The FPGA 320 and the BMC 310 check the written state data from the NVRAM 370 (416). If the state data indicates normal operation of the FPGA 320 and the BMC 310 (418), the routine loops back and the BMC 310, FPGA 320 and BIOS 360 continue to write state data to the NVRAM 370 (414). If the state data includes error information or if no information or response is written during the watchdog period (418), the routine sends a check state command to the FPGA 320 (420).

The routine determines if there is a positive response to any of the check state commands (422). If there is a positive response (422), the routine loops back to the watch dog state where the BMC 310, FPGA 320, and BIOS 360 write state data to the NVRAM 370 (414). If there is no response to any of the check state commands is received or a response indicating a failure is received (422), the BMC 310 or the FPGA 320 provide a fail state log entry (424). The FPGA 320 or the BMC 310 then calls a reset procedure to recover the respective FPGA 320 or BMC 310 (426). The reset procedure is then attempted by the BMC 310 or the FPGA 320. If the FPGA 320 or BMC 310 passes a response indicating the reset was successful (428), the routine notifies the BIOS or operating system (OS) that the BMC 310 or the FPGA 320 has recovered (430). The routine loops back and the BMC 310, FPGA 320, and BIOS 360 continue to write state data to the NVRAM 370 (414).

If the reset procedure fails to recover the respective FPGA 320 or the BMC 310 (430), the routine sends a series of check state commands to the FPGA 320 or the BMC 310 (432). The routine then determines if there is a positive response to any of the check state commands (432). If there is a positive response to any of the check state commands (432), the routine loops back to the watch dog state where the BMC 310, FPGA 320, and BIOS 360 write state data to the NVRAM 370 (414). If there is no response to any of the check state commands or a failure response is received (434), the BMC 310 or the FPGA 320 provides a fail state log entry (436). The FPGA 320 or the BMC 310 then calls for restoring the firmware image from the stored firmware image file 340 in the flash memory 330 to the FPGA 320 or the BMC 310 (438). After the firmware image has been installed on the respective FPGA 320 or BMC 310, the routine then determines whether the FPGA 320 or BMC 310 is functioning correctly (440). If the FPGA 320 or BMC 310 is functioning correctly, the routine notifies the BIOS or OS that the BMC 310 or the FPGA 320 has recovered (430). The routine then loops back and the BMC 310, FPGA 320, and BIOS 360 continue to write state data to the NVRAM 370 (414).

If the flash procedure fails (440), the routine notifies the BIOS 360 and OS that the BMC 310 or the FPGA 320 has failed (442). The BIOS 360 or the OS disables the hardware port that is connected to the failed BMC 310 or FPGA 320 (444). The BIOS 360 or OS sends an error message to the administrator (446).

One advantage of this procedure is that it allows systems that have third party customized integrated circuits to recover the failed integrated circuit automatically. Thus, this process improves system reliability by avoiding system hang up on the run time operation involving the integrated circuit. The above example routines do not need CPU cycle time to handle a polling process and do not require additional hardware for the recovery, as the units already existing in heterogeneous computing architectures are used for the recovery routine. Thus the automatic recovery of a failed integrated circuit doesn't rely on a network administrator to handle the error. Therefore, the system with the integrated circuit may be recovered within a short time period. Furthermore, the system allows for monitoring the BMC at same time, and allows for the BMC to record and monitor more third party integrated circuit information.

FIGS. 2 and 4 are flow diagrams of automatic recovery routines for systems such as those in FIGS. 1 and 3 that include a specialized integrated circuit, according to certain aspects of the present disclosure. The flow diagrams in FIGS. 2 and 4 are representative of example machine readable instructions for the process of automatic recovery of a specialized integrated circuit. In this example, the machine readable instructions comprise an algorithm for execution by: (a) a processor; (b) a controller; and/or (c) one or more other suitable processing device(s). The algorithm may be embodied in software stored on tangible media such as flash memory, CD-ROM, floppy disk, hard drive, digital video (versatile) disk (DVD), or other memory devices. However, persons of ordinary skill in the art will readily appreciate that the entire algorithm and/or parts thereof can alternatively be executed by a device other than a processor and/or embodied in firmware or dedicated hardware in a well-known manner (e.g., it may be implemented by an application specific integrated circuit [ASIC], a programmable logic device [PLD], a field programmable logic device [FPLD], a field programmable gate array [FPGA], discrete logic, etc.). For example, any or all of the components of the interfaces can be implemented by software, hardware, and/or firmware. Also, some or all of the machine readable instructions represented by the flowcharts may be implemented manually. Further, although the example algorithm is described with reference to the flowcharts illustrated in FIGS. 3-4, persons of ordinary skill in the art will readily appreciate that many other methods of implementing the example machine readable instructions may alternatively be used. For example, the order of execution of the blocks may be changed, and/or some of the blocks described may be changed, eliminated, or combined.

As used in this application, the terms "component," "module," "system," or the like generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

What is claimed is:

1. A system that provides monitoring and recovery for heterogeneous components, the system comprising:
    an integrated circuit operating with firmware, wherein the integrated circuit is one of a baseboard management controller or a field programmable gate array;
    a storage device coupled to the integrated circuit, the storage device storing a firmware image for the integrated circuit; and
    a controller coupled to the integrated circuit, wherein the controller is a baseboard management controller when the integrated circuit is the field programmable gate array, or the controller is a field programmable gate array when the integrated circuit is the baseboard management controller, and wherein the controller operable to:
        periodically determine an operational status of the integrated circuit;
        determine a failure of the integrated circuit from the determined operational status;
        send the stored firmware image to the integrated circuit in response to the determined failure;
        install the firmware image on the integrated circuit; and
        determine whether the installation of the firmware image results in restoration of the integrated circuit.

2. The system of claim 1, wherein the controller is operable to reset the integrated circuit in response to determining the failure.

3. The system of claim 1, wherein the integrated circuit sends periodic commands to the controller, and wherein the controller determines failure based on the periodic commands.

4. The system of claim 1, further comprising a non-volatile random access memory coupled to the integrated circuit and the controller, wherein the integrated circuit periodically writes state data to the non-volatile random access memory, and wherein the controller determines the failure of the integrated circuit based on the state data.

5. The system of claim 1, wherein the storage device is a flash memory.

6. The system of claim 1, wherein the controller is in communication with one of an operating system or a basic input output system (BIOS).

7. The system of claim 6, wherein the operating system or BIOS is operable to disable a hardware port connected to the integrated circuit if the installation of the firmware image does not result in restoration of the integrated circuit.

8. A method of monitoring and recovering a heterogeneous integrated circuit operating with firmware, wherein the integrated circuit is one of a baseboard management controller or a field programmable gate array the method comprising:
    storing a firmware image for the integrated circuit in a storage device;
    periodically determining an operational status of the integrated circuit via a controller wherein the controller is a baseboard management controller when the integrated circuit is the field programmable gate array, or the controller is a field programmable gate array when the integrated circuit is the baseboard management controller;
    determining a failure of the integrated circuit;
    sending the stored firmware image to the integrated circuit in response to the determination of the failure;
    installing the firmware image on the integrated circuit; and
    determining whether the installation of the firmware image results in restoration of the integrated circuit.

9. The method of claim 8, furthering comprising resetting the integrated circuit in response to determining the failure.

10. The method of claim 8, wherein failure is determined based on the periodic commands sent by the integrated circuit to the controller.

11. The method of claim 8, wherein periodically determining the operational status of the integrated circuit includes the integrated circuit writing state data to a non-volatile random access memory and the controller reading the written state data.

12. The method of claim 8, wherein the storage device is a flash memory.

13. The method of claim 8, where the controller is directed by one of an operating system or a basic input output system (BIOS).

14. The method of claim 13, further comprising disabling a hardware port connected to the integrated circuit if the installation of the firmware image does not result in restoration of the integrated circuit.

15. A computing system comprising:
  a field programmable gate array (FPGA) integrated circuit operating firmware;
  a storage device storing a firmware image of the FPGA integrated circuit coupled to the FPGA integrated circuit;
  a baseboard management controller coupled to the FPGA integrated circuit, the baseboard management controller (BMC) operable to:
    periodically determine an operational status of the FPGA integrated circuit;
    determine a failure of the FPGA integrated circuit from the determined operational status;
    send the stored firmware image to the FPGA integrated circuit in response to the determined failure;
    install the firmware image on the FPGA integrated circuit; and
    determine whether the installation of the firmware image results in restoration of the FPGA integrated circuit.

16. The computing system of claim 15, wherein the FPGA integrated circuit is operable to:
  periodically determine the operational status of the BMC;
  determine a failure of the BMC from the determined operational status;
  send a stored BMC firmware image from the storage device to the BMC;
  install the BMC firmware image on the BMC; and
  determine whether the installation of the BMC firmware image results in restoration of the BMC.

* * * * *